(12) United States Patent
Kärppä et al.

(10) Patent No.: US 11,444,544 B2
(45) Date of Patent: Sep. 13, 2022

(54) CONVERTER

(71) Applicant: ABB Schweiz AG, Baden (CH)

(72) Inventors: Jaani Kärppä, Helsinki (FI); Jorma Manninen, Helsinki (FI); Tuomas Kemppainen, Helsinki (FI)

(73) Assignee: ABB Schweiz AG, Baden (CH)

(*) Notice: Subject to any disclaimer, the term of this patent is extended or adjusted under 35 U.S.C. 154(b) by 57 days.

(21) Appl. No.: 16/914,812

(22) Filed: Jun. 29, 2020

(65) Prior Publication Data
US 2020/0412270 A1 Dec. 31, 2020

(30) Foreign Application Priority Data
Jun. 28, 2019 (EP) .................................. 19183292

(51) Int. Cl.
| | |
|---|---|
| *H05K 7/02* | (2006.01) |
| *H05K 7/04* | (2006.01) |
| *H02M 7/00* | (2006.01) |
| *H05K 5/00* | (2006.01) |
| *H05K 5/03* | (2006.01) |
| *G06F 3/048* | (2013.01) |

(52) U.S. Cl.
CPC .......... *H02M 7/003* (2013.01); *H05K 5/0017* (2013.01); *H05K 5/03* (2013.01); *G06F 3/048* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,236,002 B1* | 5/2001 | Chou | .................. | H01H 19/585 |
| | | | | 200/1 R |
| 9,310,901 B2* | 4/2016 | Wussler | ................ | G06F 3/0393 |
| 10,838,525 B2* | 11/2020 | Chu | ........................ | G06F 3/0362 |
| 2008/0055241 A1* | 3/2008 | Goldenberg | ............ | G06F 3/016 |
| | | | | 345/156 |
| 2010/0045360 A1 | 2/2010 | Howard et al. | | |

(Continued)

FOREIGN PATENT DOCUMENTS

| | | |
|---|---|---|
| CN | 101938250 A | 1/2011 |
| CN | 201887721 U | 6/2011 |

(Continued)

OTHER PUBLICATIONS

European Patent Office, Extended Search Report issued in corresponding Application No. 19183292.2, dated Jan. 7, 2020, 7 pp.

(Continued)

*Primary Examiner* — Hung S. Bui
(74) *Attorney, Agent, or Firm* — Leydig, Voit & Mayer, Ltd.

(57) ABSTRACT

A converter and a method of manufacturing a converter. The converter includes electrical components and a cover enclosing a first group of the electrical components of the converter, wherein a second group of the electrical components are printed electrical components which are embedded in the cover of the converter. The cover of the converter includes a user interface, and the user interface includes printed electrical components from the second group of electrical components.

20 Claims, 2 Drawing Sheets

(56) References Cited

U.S. PATENT DOCUMENTS

| | | | |
|---|---|---|---|
| 2010/0253653 A1* | 10/2010 | Stambaugh | H03K 17/98 345/184 |
| 2013/0198442 A1 | 8/2013 | Braun et al. | |
| 2014/0160686 A1 | 6/2014 | Benson et al. | |
| 2015/0193073 A1* | 7/2015 | Dmytriw | G06F 3/038 345/174 |
| 2019/0157885 A1 | 5/2019 | Rippel et al. | |
| 2019/0302904 A1* | 10/2019 | Nieh | G06F 3/0338 |
| 2020/0073487 A1* | 3/2020 | Ballan | G06F 3/016 |

FOREIGN PATENT DOCUMENTS

| | | |
|---|---|---|
| CN | 104641558 A | 5/2015 |
| CN | 106158316 A | 11/2016 |
| CN | 109839193 A | 6/2019 |
| DE | 10110223 A1 | 10/2001 |
| DE | 102007039170 A1 | 2/2009 |
| DE | 102017108751 A1 | 12/2017 |
| DE | 102017009043 A1 | 4/2018 |
| WO | 2014046667 A1 | 3/2014 |

OTHER PUBLICATIONS

China National Intellectual Property Administration, Office Action in Chinese Patent Application No. 202010580735.1, 19 pp. (dated May 26, 2022).

European Patent Office, Office Action in European Application No. 19183292.2, 5 pp. (dated May 11, 2022).

* cited by examiner

CONVERTER

FIELD OF THE INVENTION

The present invention relates generally to converters, and more specifically to converter with a user interface for controlling the operation of the converter.

BACKGROUND OF THE INVENTION

Converters are devices which are generally used for feeding electrical power to a load in a controlled manner. Converter receives input power and outputs controlled output voltage or current. An example of a converter is a frequency converter, which is used for producing variable frequency output voltage. Another example is an inverter which receives DC voltage input and produces variable frequency output voltage.

For controlling the operation of the converter and for setting up various parameters relating to the specific use, the converter may comprise a user interface which typically consists of buttons and displays for inputting data and for displaying data. The user interface is operatively connected to the electronics of the converter such that the operation of the converter can be directly affected, i.e. the operation of the converter may be started or stopped from the user interface and the output frequency of the converter may be controlled directly from the user interface. The user interface may also be used for giving parameters to the converter. For example, when a converter drives a motor, certain parameters relating to the motor may be fed to the converter using the user interface.

Converters, such as inverters or frequency converters, include switch components which are used in the main current path. The control of the switch components in desired manner requires electrical circuits which are able to produce suitable gate voltages for the switch components. A converter comprises thus multiple of electrical components, circuits and integrated circuits for various purposes.

It is generally known to use printed electronics. Printed electronics can be used to produce various circuit structures and resistors and capacitors, for example. Converter devices employ multiple of separate circuits which are shaped as rectangles and require space inside the structure of the converter. The use of printed electronics saves space and costs due to cost effective production technology. Further different sensors can be produced using printed technology.

Printed components can be used, for example, to replace a separate EMC-filter card which includes only passive components. Depending on the design, such a printed EMC filter can be installed directly on top of bus bars of a converter.

Advantages of printed electronics include possibility to print various components, such as resistors, capacitors, inductors, transistors, antennas, different sensors, such as gas or temperature sensors, push buttons, displays, batteries, RFID tags and heating elements. Further, printed electronics are thin and lightweight, can be installed to a surface of a device. Flexibility of printed electronics allows it to withstand mechanical vibrations and to be installed for example on top of hinges. Printed electronic components and printed electronic circuits can be electrically connected to a common circuit board.

Displays and buttons can also be produced using printed electronics. Such a display and buttons could be integrated to a converter or they could be in a separate panel. The push buttons of a user interface could include pressure sensors allowing to change the operation of the button depending on how hard the button is pushed, for example. Such buttons could, for example, change its resistance depending on the pressure they are operated. The printed electronics buttons and displays can be considered as a single component formed to an electrical circuit. Printed electronic displays are further simple to manufacture and to assemble. Further advantages of printed displays and push buttons include the same as in connection with printed electronics.

Circuit boards used in converter devices are manufactured using traditional methods and the displays used in converters are black and white displays with multiple of push buttons. Each push button is manufactured with traditional circuit board manufacturing technologies. Displays and user interfaces are further detachable and built from multiple of components, including electronics and the protective mechanics.

User interface is it's own assembly having multiple of components and requiring work to build it. Assembled user interface has to be further attached to the frame of the converter. If the frame is made of plastics, it requires attachment points which requires additional plastics both in the frame and in the user interface. The attachment place requires further space for the attachment inside the frame. Therefore a simpler and cost effective user interface and converter would be advantageous.

BRIEF DESCRIPTION OF THE INVENTION

An object of the present invention is to provide a method and an apparatus for implementing the method so as to solve the above problem. The object of the invention is achieved by a method and an apparatus which are characterized by what is stated in the independent claims. The preferred embodiments of the invention are disclosed in the dependent claims.

The invention is based on the idea of employing printed electrical components embedded in the cover of a converter device. The cover of the converter also includes a user interface which comprises printed electrical components which are embedded in the cover. When a printed electrical components and electrical circuit manufactured with printed electronics is embedded in the plastics of the cover, a separate user interface is not required. Embedded printed electronics enable to integrate a display, push buttons, slider 10 controls, actuators for acoustic and haptic feedback, speakers, various proximity sensors, LEDs and antennas to the cover.

An advantage of the apparatus of the invention is that the structure of the converter is greatly simplified. A printed circuit board which is embedded in the cover of the converter is a single component which can be wired to the other electronics of the converter. Further, the printed electronic components and the circuit board are easily manufactured with a suitable printing technology and further embedded in the plastics.

The advantage of the method of the invention is the simplicity of the manufacturing process which enables to form a robust converter structure.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
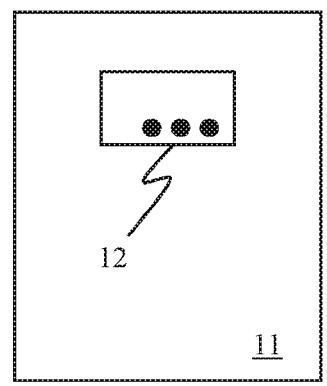
FIG. 1 shows a simplified representation of a converter having a user interface.

FIG. 1 is shows a simplified view of a converter device 11 with a user interface 12. The user interface is intended to display information relating to the converter or its use, such as current operating status, parameters which are set to the device, selected operation mode, error status, warnings or operating instructions, for example. The user interface include also inputting means, such as push buttons and rotatable switches. Inputting means are needed for operating the converter in a desired manner. The inputted data may relate to use of the converter, to the load of the converter or to operation mode of the converter, for example. A user interface may also include technologies and means for person observation in the converter device's proximity. Such proximity detecting technologies allow e.g. the user interface to turn off certain functions and save energy when the user is not present and/or to activate certain safety features when user is nearby.

According to the present invention, the converter comprises electrical components and a cover enclosing a first group of the electrical components of the converter. A second group of the electrical components are printed electrical components which are embedded in the cover of the converter. Further, the cover of the converter comprises a user interface, which comprises printed electrical components from the second group of electrical components. That is, in the converter of the invention first group of electrical components are enclosed inside the structure of the converter. These components form, for example, the main circuit path of the converter and include switch components, large capacitors, and large inductors. Further components surrounded by the cover include, for example, processors required for controlling the operation of the converter and components of auxiliary power supply devices.

In the invention, the cover of the converter comprises a user interface, and the user interface comprises printed electrical components from the second group of electrical components. In the converter of the invention, the user interface is at least partly formed of printed electrical components. Printed electrical components may also be employed for other circuits in the converter than in the user interface.

The printed electronic components are embedded to the plastics of the cover of the converter for example by injection molding. A certain technology for embedding electronic components is referred to injection molded structural electronics. In such technology, a flexible printed circuit board and/or certain components are encapsulated by plastic using injection molding. The use of printed circuit board allows to have 3D shapes in the structure. That is, the structure may, for example be curved or have edges. With a 3D shape it is referred to a shape in which the structure deviates from a plane.

According to an embodiment of the invention, a display of the user interface is formed with printed electrical components. The display may be a black and white display or a colour display. Further, in an embodiment also one or more push buttons are formed with printed electrical components which is embedded in the cover. The push buttons are preferably formed of capacitive sensors which are part of the circuit embedded in the cover of the converter. The cover of the converter may also comprise lighting components, such as LEDs, actuators, solar panels and other photovoltaic systems, energy storaging components like batteries and capacitors, antennas for receiving and/or transmitting data to/from the converter, and/or sensors which are responsive to, for example, light, impact, stress, proximity or acceleration. The antennas may be for example NFC, Bluetooth or Wlan antennas.

According to an embodiment, the user interface of the converter is detachable. A detachable user interface can be removed from its place and put back in its place. When such a user interface is formed using printed electronics, the user interface can be thinner than one with traditional manufacturing technologies. A detached user interface may communicate with the main unit of the converter using wireless communications. Further, the detachable user interface may be charged by wireless charging when in place in the main structure of the converter. The wireless charging is, for example, inductive charging. The electronics required for wireless charging, such as, induction coils, are preferably formed using printed electronics which are embedded in the plastics of the user interface. When embedded in the plastics, the coil will be placed near the outer surface of the user interface and thereby the inductive connection is effective.

According to an embodiment of the invention, the user interface comprises touch-sensitive sensors or pressure sensitive sensors arranged to form a pattern which is indicated in the surface of user interface. The pattern may, for example be a circle, and the pattern may be indicated in the surface by permanent markings. With a touch-sensitive sensors arranged in a circle, a virtual rotatable disc or wheel can be formed. Rotatable disk or wheel refers to an inputting device which is controlled by rotating the disk. As the wheel in the embodiment is virtual, the wheel is not rotating, but by rotating, for example, a finger in the path of the indicated circle, input is given to the device. With a rotatable wheel, for example, numeric values or lists can be browsed or selected quickly.

Figure 2:
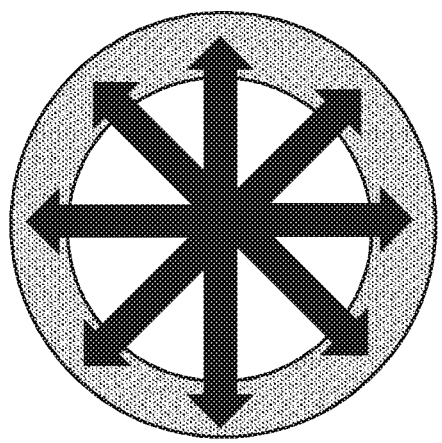
FIGS. 2 and 3 show embodiments of invention with touch-sensitive sensors embedded in the cover.
Figure 3:
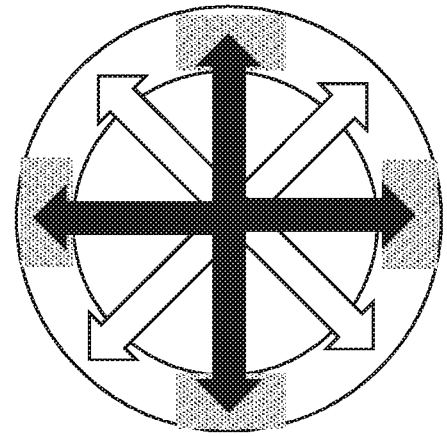

The pattern of the touch-sensitive sensors may be indicated in the surface using lights instead of permanent markings. When indicated by lights, such as LEDs, the pattern of the sensors can be changed during operation of the device. For example, sensors arranged in a circle and lit with LEDs can be changed to a pattern of arrow controller having four arrows (up, right, down, left). When the pattern is changed, it is indicated with lights and only required sensors are activated. FIG. 2 shows an embodiment in which a circle pattern is obtained using touch-sensitive sensors. Further, FIG. 3 shows the same pattern in use of four arrows. The active sensors are indicated by darkened areas.

Another example of a pattern is a straight line which can be used as a slider controller. In a slider controller several touch-sensitive sensors are used to detect a sliding touch. A slider may be used, for example, for changing a value or advancing in a list. The operation of the slider may be such that the sensors detect for example a consecutive change in circuits capacitance and change its output accordingly. Alternatively, slider may be used for indicating a value from selected range, i.e. minimum value in one end of the slider and maximum value in the other end of the slider. In selecting a value the operation principle of the slider is changed. The slider may be configured to detect a sliding motion, i.e. touches of the adjacent sensors and react when adjacent sensors are touched. In alternative configuration, the sensors arranged in a line may detect any single touch of a sensor. The sensors arranged in a line may also be situated in connection with a display. The display may be used to show different values or options which can be selected using the line or row of touch-sensitive sensors. When a display is used to show selectable options, the sensors which are close to the displayed options are activated and possibly also lit with embedded lighting elements, such as LEDs.

Another virtual input device may be formed with the printed electronics embedded in plastic cover of a converter as a knob. Knobs are generally operated by rotating the knob in either direction. Typically, higher values are obtained with rotation in clockwise direction and lower values with rotation in opposite, counter clockwise direction. With printed electronics a virtual knob can be obtained by forming in the cover a knob-like protrusion, i.e. a cylinder having a cylinder surface, in which surface touch-sensitive sensors are arranged. The sensors embedded in the cylinder surface detect user contact and specially touch in consecutive sensors. When detected, the electronics connected to sensors output a value indicating to which direction the applied pressure moves. The electronics connected to the sensors may also react to speed of the change of the user contact moving from one sensor to next sensor, i.e. the speed of rotation of the virtual knob. If desired, the electronics connected to the sensors may have different output depending on the speed of rotation. That is, if the speed of the rotation exceeds a set value, the operation mode is changed.

According to another embodiment, touch-sensitive sensors are embedded in the circular end of the cylinder-like knob. The touch-sensitive sensors are arranged in a pattern as described in detail above. The pattern may be, for example, a circle, which is close to edge of the circular end of the cylinder. The circle pattern may be used as virtual wheel as described above. The operation of the wheel and the virtual knob can be enabled at the same time, so the user may select to either rotate the virtual wheel or the knob. Alternatively, the operation of the wheel and the virtual knob can be set to be selective, that is, either the knob, i.e. the sensors at the cylinder surface, or wheel, i.e. the sensors at the circular end are enabled.

Figure 4:
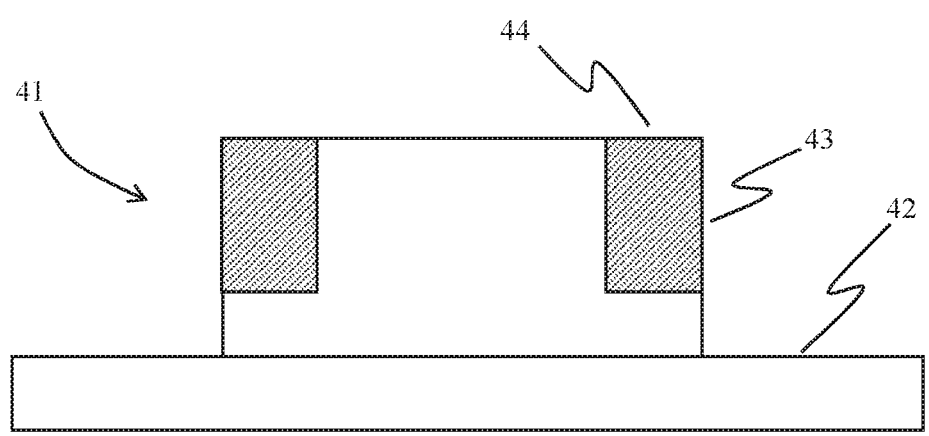
FIG. 4 shows an embodiment with a protrusion in the cover.

FIG. 4 shows a cross section of an example of a virtual knob 41 seen from the side of the knob. The knob is a protrusion in cover 42 of a converter device and it has touch-sensitive sensors 44 in the circular end of the knob. Further, touch-sensitive sensors 43 are disposed also in the cylinder surface of the knob as described above.

The same sensors which are arranged in a pattern can also be used for adapting the operation mode of the sensors. As the touch-sensitive sensors can be sensitive to the applied contact force as well, the sensors can be arranged to detect a single touch or apply of pressure having a force higher than a certain limit. Upon detection of such pressure, certain sensor patterns may be enabled or disabled. Further, the operation mode of the sensors may be changed based on repetitive pressure changes on certain sensors.

Touch-sensitive sensors may be produced with multiple of different technologies. These technologies include capacitive sensors, inductive sensors or pressure sensitive sensors. With touch-sensitive sensors it is generally referred to a sensor device or circuit which is able to react on a touch and to change a property or a value in an electrical circuit.

In the above, few possible sensor patterns are presented and described. However, it is clear that the sensors may be arranged in variety of patterns, such as arcs, for example. Further, the use of printed electronics embedded in plastic cover enables to form various other 3D shapes than the above presented cylindrical shape.

It will be obvious to a person skilled in the art that, as the technology advances, the inventive concept can be implemented in various ways. Thee invention and its embodiments are not limited to the examples described above but may vary within the scope of the claims.

The invention claimed is:

1. An electrical power converter comprising electrical components and a cover enclosing a first group of the electrical components of the converter, wherein a second group of the electrical components are printed electrical components which are embedded in the cover of the converter, wherein the cover of the converter comprises a user interface, and the user interface comprises printed electrical components from the second group of electrical components.

2. The electrical power converter as claimed in claim 1, wherein the user interface comprises at least one push button for controlling the operation of the converter, wherein the push button is formed using printed electrical components embedded in the cover of the converter.

3. The electrical power converter as claimed in claim 2, wherein the user interface comprises a display which is formed using printed electrical components embedded in the cover of the converter.

4. The electrical power converter as claimed in claim 3, wherein the user interface comprises multiple of touch-sensitive sensors formed of printed electrical components and embedded in the cover of the converter, wherein the touch-sensitive sensors are arranged in a pattern.

5. The electrical power converter as claimed in claim 4, wherein the pattern is marked on the cover of the converter.

6. The electrical power converter as claimed in claim 3, wherein the cover comprises a protrusion and one or more of the touch-sensitive sensors are embedded in the protrusion.

7. The electrical power converter as claimed in claim 1, wherein the user interface comprises multiple of touch-sensitive sensors formed of printed electrical components and embedded in the cover of the converter, wherein the touch-sensitive sensors are arranged in a pattern.

8. The electrical power converter as claimed in claim 7, wherein the pattern is marked on the cover of the converter.

9. The electrical power converter as claimed in claim 8, wherein the pattern is lit using printed electrical components.

10. The electrical power converter as claimed in claim 8, wherein the touch-sensitive sensors are arranged in a circle.

11. The electrical power converter as claimed in claim 8, wherein the touch-sensitive sensors are arranged as arrow controllers.

12. The electrical power converter as claimed in claim 7 wherein the pattern is lit using printed electrical components.

13. The electrical power converter as claimed in claim 7, wherein the touch-sensitive sensors are arranged in a circle.

14. The electrical power converter as claimed in claim 7, wherein the touch-sensitive sensors are arranged as arrow controllers.

15. The electrical power converter as claimed in claim 1, wherein the cover comprises a protrusion and one or more of the touch-sensitive sensors are embedded in the protrusion.

16. The electrical power converter as claimed in claim 15, wherein the protrusion is a cylinder shaped protrusion, and the cylinder surface comprises touch-sensitive sensors.

17. The electrical power converter as claimed in claim 15, wherein the circular end of the cylinder shaped protrusion comprises touch-sensitive sensors.

18. The electrical power converter as claimed in claim 1, wherein the converter is a frequency converter.

19. The electrical power converter as claimed in claim 1, wherein the user interface comprises a display which is formed using printed electrical components embedded in the cover of the converter.

20. A method of manufacturing an electrical power converter, the converter comprising electrical components and a cover enclosing a first group of the electrical components of the converter, wherein the method comprises,
- providing a second group of the electrical components, the second group of the electrical components being printed electrical components,
- embedding the second group of the electrical component in the cover of the converter, wherein the cover of the converter comprises a user interface, and the user interface comprises printed electrical components from the second group of electrical components.

\* \* \* \* \*